(12) United States Patent
Fan et al.

(10) Patent No.: US 10,944,339 B2
(45) Date of Patent: Mar. 9, 2021

(54) ELECTRODE DESIGN AND LOW-COST FABRICATION METHOD FOR ASSEMBLING AND ACTUATION OF MINIATURE MOTORS WITH ULTRAHIGH AND UNIFORM SPEED

(71) Applicant: BOARD OF REGENTS, THE UNIVERSITY OF TEXAS SYSTEM, Austin, TX (US)

(72) Inventors: Donglei Fan, Austin, TX (US); Kwanoh Kim, Austin, TX (US); Jianhe Guo, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 347 days.

(21) Appl. No.: 15/509,782

(22) PCT Filed: Sep. 9, 2015

(86) PCT No.: PCT/US2015/049129
§ 371 (c)(1),
(2) Date: Mar. 8, 2017

(87) PCT Pub. No.: WO2016/040443
PCT Pub. Date: Mar. 17, 2016

(65) Prior Publication Data
US 2017/0250625 A1     Aug. 31, 2017

Related U.S. Application Data

(60) Provisional application No. 62/047,969, filed on Sep. 9, 2014.

(51) Int. Cl.
*H02N 1/00* (2006.01)
*C23C 14/16* (2006.01)
(Continued)

(52) U.S. Cl.
CPC .............. *H02N 1/006* (2013.01); *B81B 5/00* (2013.01); *B82B 1/00* (2013.01); *C23C 14/00* (2013.01);
(Continued)

(58) Field of Classification Search
None
See application file for complete search history.

(56) References Cited

U.S. PATENT DOCUMENTS 3,708,403 A    1/1973   Koger et al.
7,863,798 B2   1/2011   Regan et al.
(Continued)

FOREIGN PATENT DOCUMENTS

WO    2009029859 A2    3/2009

OTHER PUBLICATIONS

Banthi (Adv Mater. 2012, vol. 24, p. 36-41) (Year: 2012).*
(Continued)

*Primary Examiner* — Xiaowei Su
(74) *Attorney, Agent, or Firm* — Meunier Carlin & Curfman LLC

(57) ABSTRACT

The invention includes miniature dots, miniature disks or miniature cylinders and methods of making the same by dispersing a particle in or on a dissolvable, meltable or etchable layer on a substrate, a portion of the particle exposed above a surface of the dissolvable, meltable or etchable layer; depositing a mask on the particles and the dissolvable substrate; removing the particles from the layer; etching an array of nanoholes in the substrate; depositing one or more metallic layers into the nanoholes to form an array of dots, disks or cylinders; and dissolving the dissolvable layer with a solvent to expose the dots, disks or cylinders. The dots, disks or cylinders can be included with two sets of microelectrodes for ultrahigh speed rotation of
(Continued)

miniature motors, and/or can be designed with a magnetic configuration into miniature motors for uniform rotation speeds and prescribed angular displacement. The invention also includes modified diatom frustules, and miniature motors containing modified diatom frustules.

16 Claims, 7 Drawing Sheets

(51) Int. Cl.
    *C23C 14/58* (2006.01)
    *H01F 41/02* (2006.01)
    *C23C 14/30* (2006.01)
    *C23C 14/04* (2006.01)
    *B81B 5/00* (2006.01)
    *B82B 1/00* (2006.01)
    *C23C 14/00* (2006.01)
    *C23C 14/02* (2006.01)
    *H01F 1/01* (2006.01)
    *H01F 7/02* (2006.01)

(52) U.S. Cl.
    CPC .......... *C23C 14/022* (2013.01); *C23C 14/025* (2013.01); *C23C 14/027* (2013.01); *C23C 14/042* (2013.01); *C23C 14/16* (2013.01); *C23C 14/30* (2013.01); *C23C 14/5873* (2013.01); *H01F 1/01* (2013.01); *H01F 7/02* (2013.01); *H01F 41/0253* (2013.01)

(56) References Cited

U.S. PATENT DOCUMENTS

| | | | |
|---|---|---|---|
| 2005/0019608 A1 | 1/2005 | Kim et al. | |
| 2005/0249980 A1* | 11/2005 | Itoh ..................... | B82Y 10/00 428/828 |
| 2005/0266416 A1 | 12/2005 | Guo et al. | |
| 2006/0124467 A1 | 6/2006 | Ho et al. | |
| 2007/0126300 A1 | 6/2007 | Greywall et al. | |
| 2012/0211467 A1 | 8/2012 | Wang et al. | |
| 2013/0241344 A1 | 9/2013 | Wang et al. | |
| 2013/0327636 A1 | 12/2013 | Majetich et al. | |

OTHER PUBLICATIONS

Kim (ACS Nano, 2013, vol. 7, No. 4, p. 3476-3483, Published online Mar. 13, 2013). (Year: 2013).*
Kim'2014 (Nature Communications, Published on Apr. 7). (Year: 2014).*
International Search Report and Written Opinion issued in Application No. PCT/US2015/049129, dated Jan. 11, 2016.
International Preliminary Report on Patentability issued in Application No. PCT/US2015/049129, dated Mar. 23, 2017.
Bhushan, et al., "Nanotribology and nanomechanics of MEMS/NEMS and BioMEMS/BioNEMS materials and devices", Microelectron. Eng. 84, 2007, 387-412.
Douglas, et al., "A logic-gated nanorobot for targeted transport of molecular payloads", Sci. Signal. 335, 2012, 831-834.
Ekinci, et al., "Nanoelectromechanical systems", Rev. Sci. Instrum. 76, 2005, 061101.
Fan, et al., "Controllable high-speed rotation of nanowires", Phys. Rev. Lett. 94, 2005, 247208.
Fan, et al., "Electric tweezers.", Nano Today 6, 2011, 339-354.
Fan, et al., "Electronic properties of nanoentities revealed by electrically driven rotation.", Proc. Natl. Acad. Sci. USA 109, 2012, 9309-9313.
Fan, et al., "Precision transport and assembling of nanowires in suspension by electric fields", Appl. Phys. Lett. 92, 2008, 093115.

Fan, et al., "Subcellular-resolution delivery of a cytokine Yia precisely manipulated nanowires", Nature Nanotech. 5, 2010, 545-551.
Fennimore, et al., "Rotational actuators based on carbon nanotubes", Nature 424, 2003, 408-410.
Fournier-Bidoz, et al., "Synthetic self-propelled nanorotors", Chem. Commun., 2005, 441-443.
Frechette, et al., "High-speed microfabricated silicon turbomachinery and fluid film bearings", J. Microelectromech. Syst. 14, 2005, 141-152.
Frechette, et al., "An electrostatic induction micromotor supported on gas-lubricated bearings", IEEE MEMS 2001, 2001, 290-293.
Gao, et al., "In vivo cancer targeting and imaging with semiconductor quantum dots", Nat. Biotechnol. 22, 2004, 969-976.
Garcia, et al., "Surface micromachined microengine", Sensors Actuat. A—Phys. 48, 1995, 203-214.
Ghalichechian, et al., "Design, fabrication, and characterization of a rotary micromotor supported on microball bearings", J. Microelectromech. Syst. 17, 2008, 632-642.
He, et al., "Designing catalytic nanomotors by dynamic shadowing growth", Nano Lett. 7, 2007, 1369-1375.
Judy, et al., "Microelectromechanical systems (MEMS): fabrication, design and applications", Smart Mater. Struct. 10, 2001, 1115-1134.
Keshoju, et al., "Magnetic field driven nanowire rotation in suspension", Appl. Phys. Lett. 91, 2007, 123114.
Kim, et al., "Ultrahigh-speed rotating nanoelectromechanical system devices assembled from nanoscale building blocks", Nat. Commun. 5, 2014, 3632.
Kline, et al., "Catalytic nanomotors: remote-controlled autonomous movement of striped metallic nanorods", Angew. Chem.Int. Ed. Engl. 44, 2005, 744-746.
Lee, et al., "High-sensitivity microfluidic calorimeters for biological and chemical applications", Proc. Natl. Acad. Sci. USA 106, 2009, 15225-15230.
Lee, et al., "Effect of geometry on magnetic domain structure in Ni wires with perpendicular anisotropy: a magnetic force microscopy study", Phys. Rev. B 77, 2008, 132408.
Li, et al., "Ultra-sensitive NEMS-based cantilevers for sensing, scanned probe and very high-frequency applications", Nature Nanotech. 2, 2007, 114-120.
Ozin, et al., "Dream nanomachines", Adv. Mater. 17, 2005, 3011-3018.
Peiris, "Enhanced delivery of chemotherapy to tumors using a multicomponent nanochain with radio-frequency-tunable drug release", ACS Nano 6, 2012, 4157.
Pryce, et al., "Highly strained compliant optical metamaterials with large frequency tunability", Nano Lett. 10, 2010, 4222-4227.
Purcell, et al., "Life at low Reynolds number", Am. J. Phys. 45, 1997, 3-11.
Roukes, et al., "Nanoelectromechanical systems face the future", Phys. World 14, 2001, 25-31.
Soong, et al., "Powering an inorganic nanodevice with a biomolecular motor", Science 290, 2000, 1555-1558.
Sundararajan, et al., "Drop off of colloidal cargo transported by catalytic Pt—Au nanomotors via photochemical stimuli", Small 6, 2010, 1479-1482.
Tai, et al.,"IC-processed micro-motors: design, technology, and testing", IEEE MEMS, 1989, i-6.
Wang, et al., "Cargo-towing synthetic nanomachines: Towards active transport in microchip", Lab Chip 12, 2012, 1944-1950.
Whitney, et al., "Fabrication and magnetic properties of arrays of metallic nanowires", Science 261, 1993, 1316-1319.
Xia, et al., "Onedimensional nanostructures: synthesis, characterization, and applications", Adv. Mater. 15, 2003, 353-389.
Xu, et al., "Near-field enhanced magnetic plasmonic bifunctional nanotubes for single cell bioanalysis", Adv. Funct. Mater. 23, 2013, 4332-4338.
Xu, et al., "Ordered Arrays of Raman Nanosensors for Ultrasensitive and Location Predictable Biochemical Detection." Adv. Mater. 24, 2012, 5457-5463.
Yan, et al., "Nanowire-based singlecell endoscopy", Nature Nanotech. 7, 2012, 191-196.

(56) References Cited

OTHER PUBLICATIONS

Yuzvinsky, et al., "Controlled placement of highly aligned carbon nanotubes for the manufacture of arrays of nanoscale torsional actuators", Nanotechnology 17, 2006, 434-438.

* cited by examiner

ELECTRODE DESIGN AND LOW-COST FABRICATION METHOD FOR ASSEMBLING AND ACTUATION OF MINIATURE MOTORS WITH ULTRAHIGH AND UNIFORM SPEED

CROSS-REFERENCE TO RELATED APPLICATIONS

This application claims the benefit of U.S. Provisional Application 62/047,969, filed on Sep. 9, 2014, the contents of which is hereby incorporated in its entirety.

STATEMENT OF FEDERALLY FUNDED RESEARCH

This invention was made with government support under Grant no. CMMI1150767 awarded by the National Science Foundation. The government has certain rights in the invention.

TECHNICAL FIELD OF THE INVENTION

The present invention relates in general to the field of miniature motors, and more particularly, to a novel electrode design and low-cost fabrication method for assembling and actuation of miniature motors with ultrahigh and uniform speed.

BACKGROUND OF THE INVENTION

Without limiting the scope of the invention, its background is described in connection with miniature motors.

U.S. Pat. No. 7,863,798, issued to Regan, et al., is entitled "Nanocrystal powered nanomotor". Briefly, these inventors teach a nanoscale nanocrystal used as a reciprocating motor comprising a substrate having an energy differential across it, e.g. an electrical connection to a voltage source at a proximal end; an atom reservoir on the substrate distal to the electrical connection; a nanoparticle ram on the substrate distal to the atom reservoir; a nanolever contacting the nanoparticle ram and having an electrical connection to a voltage source, whereby a voltage applied between the electrical connections on the substrate and the nanolever causes movement of atoms between the reservoir and the ram. Movement of the ram causes movement of the nanolever relative to the substrate. The substrate and nanolever can comprise multiwalled carbon nanotubes (MWCNTs) and the atom reservoir and nanoparticle ram are preferably metal (e.g. indium) deposited as small particles on the MWCNTs. The substrate may be a silicon chip that has been fabricated to provide the necessary electrodes and other electromechanical structures, and further supports an atomic track, which may comprise a MWCNT.

United States Patent Application Publication No. 2012/0211467, filed by Wang, et al., is entitled "Nanomotor-based patterning of surface microstructures". Briefly, these applicants are said to teach methods, systems and apparatus for implementing nanomotor-based micro- and nanofabrication. In one aspect, a method of fabricating nanoobjects by functionalizing a nanomotor with a reagent. The method can also include controlling a movement of the functionalized nanomotor in a solution containing material to react with the reagent to induce a localized deposition or precipitation of a product onto a surface of a substrate or etching of the substrate.

United States Patent Application Publication No. 2005/0266416, filed by Guo, is entitled "Molecular nanomotor." Briefly, this applicant is said to teach a molecular nanomotor useful for translocating polynucleotides, wherein the nanomotor is a multimolecular complex fueled by ATP hydrolysis. In one example, one of the motor components is an ATP-binding RNA molecule that participates in ATPase activity.

SUMMARY OF THE INVENTION

In one embodiment, the present invention includes a miniature motor containing a miniature rotor magnetically attached to a patterned substrate. The rotors and the patterned substrate may be formed from miniature dots, disks, cylinders and the like. In certain embodiments, the pattern is formed on the substrate from nanodots, nanodisks, nanocylinders and combinations thereof. The miniature rotors may be nanocylinders, nanowires, or modified diatom frustules.

In another embodiment, the present invention includes a method of making miniature dots, miniature disks or miniature cylinders comprising the steps of: dispersing one or more particles in or on a dissolvable, meltable or etchable layer coated or deposited on a substrate, wherein at least a portion of the one or more particles is exposed above a surface of the dissolvable, meltable or etchable layer; depositing a mask on the particle monolayer and the dissolvable substrate; removing one or more of the particles from the substrate; etching an array of nanoholes in the substrate; depositing one or more metallic layers into the nanoholes to form an array of miniature dots, miniature disks or miniature cylinders; and dissolving the dissolvable layer with a solvent to expose the miniature dots, miniature disks or miniature cylinders. In certain embodiments, miniature dots, miniature disks and miniature cylinders are nanodots, nanodisks and nanocylinders. In one aspect, the one or more metallic layers comprise at least one of aluminum, antimony, beryllium, cadmium, chromium, cobalt, copper, gold, iron, lead, magnesium, manganese, mercury, molybdenum, nickel, niobium, platinum, plutonium, potassium, rhodium, selenium, silicon, silver, sodium, tantalum, thorium, tin, titanium, tungsten, uranium, or zinc. In another aspect, the one or more metallic layers form a magnet that comprises a non-magnetic layer/magnetic layer/adhesion layer. In another aspect, the one or more metallic layers form a magnet that comprises a non-magnetic layer/magnetic layer/adhesion layer; wherein the non-magnetic layer can be Cr, Au, Ti, carbon, graphene, graphite, silicon dioxide, Ag, Cu, polymer or other non-magnetic materials; wherein the magnetic layer can be Ni, Co, Fe, FeCo, FeNi, and any nonmetallic magnetic materials; and/or wherein the adhesion layer can be Cr or Ti. In another aspect, the mask is an etch mask selected from a metal, ceramic, nitride or oxide that is not reactive with an oxygen plasma. In another aspect, the mask is at least one of a metal, an oxide, or a nitride layer selected from chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, or molybdenum. In another aspect, the dissolvable, meltable or etchable layer is selected from at least one of a polycarbonate (PC), triacetate cellulose (TAC), poly(methyl methacrylate) (PMMA), and cyclo-olefin polymer (COP), polyvinylpyrrolidone (PVP), polyethersulfone (PES), polyetherimide (PEI), polyamide (PA), polystyrene (PS), polyvinylidene fluoride (PVDF), polyacrylonitrile (PAN), polysulfone (PSU), polyurethane (PU), esterified cellulose (EC), acrylonitrile butadiene styrene polymer (ABS), fluoropolymers, polyamides, polyarylates, thermoplastic polyesters (PET, PBT), thermoplastic polyimides (PI, PAI, PEI), polyoxymethylene (POM), polyacetal, polyphenylene oxide (PPO), polyaryletherketones (PEEK, PEK), polysulphones (PSUL, PES), polyphenylene sulphide (PPS), polyethylene, polypropylene, polyphenylene sulfide, polystyrene, polyvinyl chloride, polycarbonate, polylactic acid, polyether sulfide, or polymethacrylate. In another aspect, the particle is selected from at least one of biomaterial, metal, dioxide, and polymer, such as silicon dioxide, polystyrene, polycarbonate, aluminum, antimony, beryllium, cadmium, chromium, cobalt, copper, gold, iron, lead, magnesium, manganese, mercury, molybdenum, nickel, niobium, platinum, plutonium, potassium, rhodium, selenium, silicon, silver, sodium, tantalum, thorium, tin, titanium, tungsten, uranium, or zinc. The particle can be a nanoparticle, a microparticle, or a mixture of both. In some instances, the biomaterial is a diatom frustule. In another aspect, the particles are generally at least one of spherical, ovoidal, cylindrical, trapezoidal, polyhedral, or star-shaped. In another aspect, the particles are generally uniformly dispersed in or on the dissolvable, meltable or etchable layer. In another aspect, the etching is ion etching selected from at least one of plasma etching (PE), a reactive ion etching (RIE), or an ion beam etching (IBE), or chemical etching. In another aspect, the etching is ion etching selected from at least one of oxygen, tetrafluorocarbon, trifluoromethane, argon, or sulfur hexafluoride. In another aspect, the method further comprises the step of selecting a solvent selected from acetone, PR thinners and positive resist removers, PG Remover or an oxygen plasma treatment. In another aspect, the miniature magnets are a miniature sphere or a miniature cylinder. In another aspect, the miniature disk or cylinder is a magnet and a miniature rotor is positioned on, adjacent to, or off-center of the magnet to form a miniature motor.

In another embodiment, the present invention includes a method of making a miniature magnet comprising the steps of: dispersing a particle monolayer on a dissolvable, meltable or etchable layer coated or deposited on a substrate; depositing an etch mask on the particle monolayer and the substrate; removing the particles from the substrate; etching an array of nanoholes in the substrate; depositing one or more metallic layers including a magnetic layer into the nanoholes to form an array of magnetic miniature dots; and dissolving the lithographic substrate to release the miniature magnets. In one aspect, the one or more metallic layers form a magnet that comprises non-magnetic layer/magnetic layer/adhesion layer; the non-magnetic layer can be Cr, Au, Ti, carbon, graphene, graphite, silicon dioxide, Ag, Cu, polymer and/or and non-magnetic material; the magnetic layer can be Ni, Co, Fe, FeCo, FeNi, and any nonmetallic magnetic materials; the adhesion layer can be Cr or Ti. In another aspect, the mask is an etch mask selected from a metal, ceramic, nitride or oxide that is not reactive with an oxygen plasma. In another aspect, the mask is a metal or oxide, or nitride layer selected from chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, or molybdenum. In another aspect, the dissolvable, meltable or etchable layer is selected from at least one of a polycarbonate (PC), triacetate cellulose (TAC), poly(methyl methacrylate) (PMMA), and cyclo-olefin polymer (COP), polyvinylpyrrolidone (PVP), polyethersulfone (PES), polyetherimide (PEI), polyamide (PA), polystyrene (PS), polyvinylidene fluoride (PVDF), polyacrylonitrile (PAN), polysulfone (PSU), polyurethane (PU), esterified cellulose (EC), acrylonitrile butadiene styrene polymer (ABS), fluoropolymers, polyamides, polyarylates, thermoplastic polyesters (PET, PBT), thermoplastic polyimides (PI, PAI, PEI), polyoxymethylene (POM), polyacetal, polyphenylene oxide (PPO), polyaryletherketones (PEEK, PEK), polysulphones (PSUL, PES), polyphenylene sulphide (PPS), polyethylene, polypropylene, polyphenylene sulfide, polystyrene, polyvinyl chloride, polycarbonate, polylactic acid, polyether sulfide, or polymethacrylate. In another aspect, the particle is selected from at least one of biomaterial, metal, dioxide, and polymer, such as silicon dioxide, polystyrene, polycarbonate, aluminum, antimony, beryllium, cadmium, chromium, cobalt, copper, gold, iron, lead, magnesium, manganese, mercury, molybdenum, nickel, niobium, platinum, plutonium, potassium, rhodium, selenium, silicon, silver, sodium, tantalum, thorium, tin, titanium, tungsten, uranium, or zinc. The particle can be a nanoparticle, a microparticle, or a mixture of both. In some instances, the biomaterial is a diatom frustule. In another aspect, the particles are generally at least one of spherical, ovoidal, cylindrical, trapezoidal, polyhedral, or star-shaped. In another aspect, the particles are generally uniformly dispersed in or on the dissolvable, meltable or etchable layer. In another aspect, the etching is ion etching selected from at least one of plasma etching (PE), a reactive ion etching (RIE), or an ion beam etching (IBE), or chemical etching. In another aspect, the etching is ion etching selected from at least one of oxygen, tetrafluorocarbon, trifluoromethane, argon, or sulfur hexafluoride. In another aspect, the method further comprises the step of selecting a solvent selected from acetone, PR thinners and positive resist removers, PG Remover or an oxygen plasma treatment. In another aspect, the miniature disk or cylinder is a magnet and a miniature rotor is positioned on, adjacent to, or off-center of the magnet to form a miniature motor.

In another embodiment, the present invention includes a method of making a miniature motor comprising: depositing on a substrate a first and second set of quadrupole electrodes, wherein the first set of quadrupole electrodes are interspersed between the second set of quadrupole electrodes about an opening; and positioning one or more patterned magnetic miniature motors comprising a nanobearing and a miniature rotor in the opening, wherein the miniature motors rotate with a reduced or no periodic rotational fluctuation. In one aspect, the first set of quadrupole electrodes is separated by at least 300 µm. In another aspect, the second set of quadrupole electrodes is separated by gaps of equal or less than 100 µm. In another aspect, the rotation of the motor is not sinusoidal.

In one embodiment, the present invention includes an ultrahigh speed miniature motor comprising: a first and second set of quadrupole electrodes disposed on a substrate, wherein the first set of quadrupole electrodes are interspersed between the second set of quadrupole electrodes about an opening; and one or more miniature motors in the opening, wherein the one or more miniature motors rotate with a reduced or no periodic rotational fluctuation. In one aspect, the first set of quadrupole electrodes is separated by at least 300 µm. In another aspect, the second set of quadrupole electrodes is separated by gaps of less than 100 µm. In another aspect, the rotation of the motor is not sinusoidal.

A miniature motor can be made by the method of dispersing a particle in or on a dissolvable, meltable or etchable layer coated or deposited on a substrate, wherein at least a portion of the particle is exposed above a surface of the dissolvable, meltable or etchable layer; depositing a mask on the particle monolayer and the dissolvable substrate; removing the particles from the substrate; etching an array of nanoholes in the substrate; depositing two or more metallic layers into the nanoholes to form an array of miniature dots, miniature cylinders or miniature disks; and dissolving the dissolvable layer with a solvent to release the miniature magnet or a multi-layer miniature disk or cylinder. In certain embodiments, miniature dots, miniature disks and miniature cylinders are nanodots, nanodisks and nanocylinders.

A miniature motor comprising a miniature rotor disposed on a nanomagnetic bearing can be made by the process of dispersing a particle monolayer in or on a dissolvable, meltable or etchable layer coated or deposited on a substrate, wherein at least a portion of the particle is exposed above a surface of the dissolvable, meltable or etchable layer; depositing a mask on the particle monolayer and the dissolvable substrate; removing the particles from the substrate; etching an array of nanoholes in the substrate; depositing two or more metallic layers into the nanoholes to form an array of miniature dots, miniature cylinders or miniature disks; and dissolving the dissolvable layer with a solvent to release the miniature magnet or a multi-layer miniature disk or cylinder. In certain embodiments, miniature dots, miniature disks and miniature cylinders are nanodots, nanodisks and nanocylinders.

In another embodiment, the present invention includes a miniature motor having a perpendicular magnetic configuration comprising: a miniature rotor; and a patterned magnet, wherein the patterned magnet has a magnetic orientation perpendicular to the plane of rotation of the miniature rotor, and wherein the miniature rotor is on, adjacent to, or off center from the longitudinal axis of the patterned magnet. The miniature rotor can be a nanowire, modified diatom frustule, or nanocylinders. The miniature rotor also has a magnetic orientation perpendicular to the plane of rotation of the miniature rotor. In one aspect, the miniature rotor of the nanomotor rotates at a stable and uniform speed. In another aspect, the patterned magnet comprises a non-magnetic layer/magnetic layer/adhesion layer. In another aspect, the patterned magnet comprises a non-magnetic layer/magnetic layer/adhesion layer and wherein the one or more metallic layers form a magnet that comprises a non-magnetic layer/magnetic layer/adhesion layer; wherein the non-magnetic layer can be Cr, Au, Ti, carbon, graphene, graphite, silicon dioxide, Ag, Cu, polymer or other non-magnetic materials; wherein the magnetic layer can be Ni, Co, Fe, FeCo, FeNi, and any nonmetallic magnetic materials; and/or wherein the adhesion layer can be Cr or Ti.

In another embodiment, the present invention includes a miniature dot, miniature disk or miniature cylinder made by a process comprising: dispersing a particle in or on a dissolvable, meltable or etchable layer coated or deposited on a substrate, wherein at least a portion of the particle is exposed above a surface of the dissolvable, meltable or etchable layer; depositing a mask on the particles and the dissolvable substrate; removing the particles; etching an array of nanoholes in the substrate; depositing one or more metallic layers into the nanoholes to form an array of miniature dots, miniature cylinders or miniature disks; and dissolving the dissolvable layer with a solvent to expose the miniature dots, miniature disks or miniature cylinders. In certain embodiments, miniature dots, miniature disks and miniature cylinders are nanodots, nanodisks and nanocylinders.

In another embodiment, the present invention includes a patterned miniature dot, miniature disk or miniature cylinder comprising: a non-magnetic layer and a magnetic layer/adhesion layer, wherein the non-magnetic layer can be at least one of Cr, Au, Ti, carbon, graphene, graphite, silicon dioxide, Ag, Cu, polymer or any nonmetallic magnetic material; the magnetic layer can be selected from Ni, Co, Fe, and alloys that include one or more elements selected from Ni, Co, Fe or any nonmetallic magnetic material; and the adhesion layer can be Cr or Ti. In certain embodiments, the miniature dots, miniature disks and miniature cylinders are nanodots, nanodisks and nanocylinders.

In another embodiment, the present invention includes a miniature motor containing a modified diatom frustule rotors having a mask layer covering a portion of frustule, wherein the mask layer has a plurality of nanoholes, and wherein the nanoholes comprise at least one or more metallic layer. The one or more metallic layers can include a non-magnetic layer, a magnetic layer, and an adhesion layer. In some embodiments, the non-magnetic layer can be at least one of Cr, Au, Ti, carbon, graphene, graphite, silicon dioxide, Ag, Cu, polymer or any nonmetallic magnetic material; the magnetic layer can be selected from Ni, Co, Fe, and alloys that include one or more elements selected from Ni, Co, Fe or any nonmetallic magnetic material; and the adhesion layer can be Cr or Ti.

In certain embodiments, the non-magnetic layer can be a robust material which enhances the durability of the device. Exemplary robust materials include Ti, graphite and diamond thin film.

BRIEF DESCRIPTION OF THE DRAWINGS

For a more complete understanding of the features and advantages of the present invention, reference is now made to the detailed description of the invention along with the accompanying figures and in which:

(FIG. 1A) polystyrene (PS) nanospheres are dispersed on a PMMA-coated substrate; (FIG. 1B) a Cr thin film is deposited; (FIG. 1C) the PS nanospheres are removed; (FIG. 1D) the PMMA template with an array of nanoholes is formed by oxygen reactive ion etching (RIE); (FIG. 1E) the Cr/Ni/Au thin films are deposited into the nanoholes and form a large array of magnetic nanodisks; (FIG. 1F) the PMMA and the metals on it are lifted off.

(FIG. 9B) a metal-coated diatom frustule (I) and a nanowire assembled on patterned magnets. Rotation of the frustule and nanowire motor in the same direction at 10 kHz (FIG. 9C), the nanowire motor only at 45 kHz (FIG. 9D), the frustule and nanowire motor in the opposite direction at 60 kHz (FIG. 9E), and the frustule motor only at 200 kHz (FIG. 9F).

DETAILED DESCRIPTION OF THE INVENTION

Figure 1A:
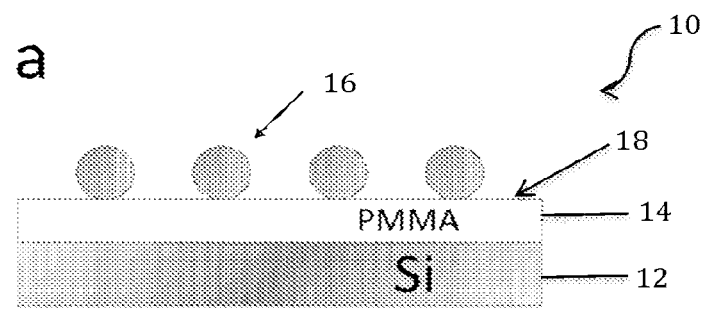
FIGS. 1A to 1F show the fabrication processes of wafer scale nanomagnets.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein, the adjective "miniature" includes both nano-sized and micro-sized objects, e.g., motors and particles. Unless otherwise specified, "particles" includes spheres, rods, cylinders, disks and other shapes. A nanoparticle is a particle having at least one, and preferably all, dimensions from 1 to 1000 nm. A microparticle is a particle having at least one, and preferably all, dimensions from 1 to 1000 microns.

Based on a conventional top-down process such as electron beam lithography (EBL), patterning nanomagnets, one of the key components of the nanomotor, is a bottleneck of a nanomotor fabrication process. To overcome the low productivity, the colloidal lithography that uses micro/nanospheres as etch masks, has been developed and widely used for patterning nanostructures on a large scale. However, these spheres are not durable enough to work as etch masks depending on materials to be etched, such as Ni and Cr.

Rather that etching away the spheres, in certain embodiments of the present invention, the metal thin films in unwanted areas are lifted off with a sacrificial PMMA/Cr template. The spheres serve as shadow masks during deposition of an etch-resistant mask on, e.g., a PMMA layer, for the pattern transfer rather than etch masks. In contrast with the conventional colloidal lithography, this method is applicable to any metals and even multilayer miniature rods, miniature spheres, or disks can be fabricated with ease. Moreover, the miniature rods, miniature spheres, or disks fabricated using the method of the present invention have a controlled morphology owing to not only the templates with large undercut (perfect for a lift-off process), but do not encounter dry etching issues, e.g., redeposition.

The present inventors recognize herein that in a miniature motor system, the electric fields generated by quadrupole electrodes play a role in transporting miniature rotors to patterned magnetic nanobearings for assembly of nanomotors as well as actuating the assembled nanomotors. One set of electrodes can serve both purposes. Although reducing the distance between the electrodes can enhance the rotation speed, this technique is limited because the gaps between electrodes need to be wide enough to accommodate plenty of miniature rotors dispersed over a large area for efficient nanomanipulation and assembly. The miniature motor disclosed and claimed herein can include two sets of electrodes responsible for fabrication and actuation separately. One set of electrodes with wide gaps can be used to manipulate miniature entities dispersed in a large area, while the other set of electrodes has narrow gaps and can be used to provide an assembled miniature motor with highly concentrated driving power for extremely fast rotation. In this way, it is possible to achieve a high performance miniature motor without sacrificing assembly efficiency.

The disclosed design of the magnetic orientations of the magnetic elements in both the bearings and rotors results in uniformly rotating miniature motors of this type for the first time. Now, they can perform like step motors. In comparison, in the inventor's previous report (Nature Communications, 5, 3632, 2014), the rotation speed of nanomotors was always sinusoidal.

In certain embodiments, there is provided an electrode set and a facile fabrication process for an ultrahigh speed rotational miniature motor that can rotate to at least 18,000 rpm. The miniature motors possess significantly improved the rotation speed uniformity (e.g., having little or no periodic oscillations in speed) as miniature scale stepmotors. The miniature motors further possess significantly improved durability, capable of over 500,000, 750,000, 1,000,000, 1,250,000, 1,500,000, 1,750,000 or even 2,000,000 rotations prior to failure.

The following is one example of how a miniature motor is made of a nanowire rotor driven on a patterned magnetic nanobearing in the electric fields created by the AC voltages applied to quadrupole electrodes. The skilled artisan will recognize, based on this detailed example, that various broadening modifications, variations, and substitutions of materials can be used with the present invention. In some embodiments, the rotating part of the miniature motor, a multi-layer miniature magnet or a multi-layer miniature disk or cylinder can be made by dispersing a miniature sphere monolayer on a dissolvable, meltable or etchable layer coated or deposited on a substrate; depositing a mask on the miniature sphere monolayer and the dissolvable substrate; removing the miniature spheres from the substrate; etching an array of nanoholes in the substrate by etching; depositing two or more metallic layers into the nanoholes to form an array of dots, cylinders or disks; and dissolving the dissolvable layer with a solvent to release the miniature magnet or a multi-layer miniature disk or cylinder.

In certain embodiments, the rotor is a modified diatom frustule. Diatoms are single celled algae (1-500 microns) which have a silica based outer shell (frustule). The frustule contains a plurality of pores, channels or other openings to facilitate transport of nutrients and waste into and away from the algae. Diatom frustules occur in a wide variety of shapes and sizes, and are readily available in large quantity at low price. Furthermore, the specific shape of the frustule is species specific, and therefore a large number of substantially identical frustules can be obtained through cultivation of a certain diatom species. In certain aspects of the invention, the micromotors are prepared from substantially identical frustules, and as such the micromotors are also substantially identical.

Diatom frustules can be manipulated similar to other particles described above. In some embodiments, modified frustules can be made by the process of dispersing a diatom frustule monolayer in or on a dissolvable, meltable or etchable layer coated or deposited on a substrate, wherein at least a portion of the frustule is exposed above a surface of the dissolvable, meltable or etchable layer; depositing a mask on the frustule monolayer and the dissolvable substrate; removing the frustule from the substrate; etching an array of nanoholes in the substrate; and depositing two or more metallic layers into the nanoholes.

As can be seen from this general discussion, a number of variations can be made to the method, including the initial shape of the miniature motor (for example, the shaft of the miniature motor, which can be a miniature magnet, can be generally spherical, cylindrical, ovoidal, polyhedral, coneshaped, or any shape that will allow for rotation. Likewise, the skilled artisan will recognize that the miniature sphere (that is disposed in or on the dissolvable, meltable or etchable layer coated or deposited on a substrate) can have a wide variety of shapes (ovoidal, cylindrical, trapezoidal, polyhedral, star-shaped, etc.), so long as it allows for rotation. Once the nanospaces or openings are formed in the dissolvable, meltable or etchable layer, one or more layers can be deposited within the nanopenings, which may include layers that form a magnetic material. Non-limiting examples of layers that form a magnetic material include, but are not limited to non-magnetic layer/magnetic layer/adhesion layer; the non-magnetic layer can be Cr, Au, Ti, carbon, graphene, graphite, silicon dioxide, Ag, Cu, polymer and other non-magnetic materials; the magnetic layer can be Ni, Co, Fe, FeCo, FeNi, and any nonmetallic magnetic materials; the adhesion layer can be Cr or Ti. In certain preferred embodiments, the non-magnetic layer is Au, and in other embodiments, the non-magnetic layer is Ti, graphite, or diamond thin film, preferably Ti.

The dissolvable, meltable or etchable layer can be made from a wide variety of polymers or other materials that are dissolvable, meltable or etchable. Non-limiting examples of dissolvable, meltable or etchable materials include but are not limited to, polyethylene terephthalate (PET), polycarbonate (PC), triacetate cellulose (TAC), poly(methyl methacrylate) (PMMA), and cyclo-olefin polymer (COP), polyvinylpyrrolidone (PVP), polyethersulfone (PES), polyetherimide (PEI), polyamide (PA), polystyrene (PS), polyvinylidene fluoride (PVDF), polyacrylonitrile (PAN), polyimide (PI), polysulfone (PSU), polyurethane (PU), esterified cellulose (EC), acrylonitrile butadiene styrene polymer (ABS), fluoropolymers, polyamides, polyarylates, thermoplastic polyesters (PET, PBT), thermoplastic polyimides (PI, PAI, PEI), polyoxymethylene (POM), polyacetal, polyphenylene oxide (PPO), polyaryletherketones (PEEK, PEK), polysulphones (PSUL, PES), polyphenylene sulphide (PPS), polyethylene, polypropylene, polyphenylene sulfide, polystyrene, polyvinyl chloride, polycarbonate, polylactic acid, polyether sulfide, polymethacrylate, and combinations thereof, as examples.

The mask that is resistant to, e.g., plasma etching (PE), a reactive ion etching (RIE), or an ion beam etching (IBE), or chemical etching, can include but are not limited to, e.g., the mask is a metal layer selected from chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, and silicon oxides, for example.

In certain embodiments, the patterned nanomagnets, fabricated within a set of microelectrodes using poly-methyl methacrylate (PMMA)/Cr templates prepared through colloidal lithography, have high density, uniformity, and reproducibility at low cost. The fabrication includes a few steps: firstly, a polystyrene (PS) nanosphere monolayer is uniformly dispersed on the surface of a PMMA film; a thin layer of Cr is deposited on top of the PMMA film; after the removal of the PS nanospheres, arrays of nanoholes are formed on the PMMA film by oxygen reactive ion etching (RIE) using the Cr layer as an etch mask; next, the Cr/Ni/Au thin films are deposited into the nanoholes and form a large array of magnetic nanodisk. Finally, the PMMA is dissolved using the PMMA remover. The density and size of the nanomagnets could be well controlled by the concentration and the size of the PS nanospheres in the suspension and the process enables wafer-scale fabrication of nanomagnets at low cost, compare to the conventional lithographic techniques. Multiple types of rotors can be incorporated onto the same device.

Now, on the substrate with a large array of nanomagnets, the present inventors fabricated two sets of microelectrodes dedicated to the assembling and the actuation of a nanomotor for ultrahigh speed rotation, respectively. One set of electrode was designed with a wider gap distance (e.g. >300 µm) to remotely control and transport dispersed miniature rotors over a large area for the assembly, and the other set of microelectrodes with much narrow gaps (e.g. <100 μm) was fabricated around the assembled nanomotors to induce high intensity electric fields and, consequently, a large torque for the actuation.

As a result, the nanomotor of the present invention achieved a rotation speed to at least 18,000 rpm, which is the fastest rotating man-made nanoscale motors fixed at a designed position. Note the inventors' previous work (Nature Communications, 5, 3632, 2014), the rotation speeds of nanomotors periodically oscillated with angle/time. In this disclosure, the inventors have overcome the rotation periodicity of motors by designing the magnetic anisotropy of both the miniature rotors and magnetic bearings to have perpendicular anisotropy. As a result, this type of miniature motor is like a step motor, having little or no periodic rotation speed fluctuation.

As high-speed and high-power nanomotors with uniform rotation speed are extremely important for miniature devices including nanomachines, nanoelectromechanical system (NEMS) devices, lab-on-a-chip architectures, biomedical devices, microfluidics, and nanorobots, the present invention provides a uniform and ultrahigh speed nanomotor fabricated through a highly efficient and cost-effective process.

Example 1—Fabrication of Large Arrays of Magnetic Bearings

Figure 1B:
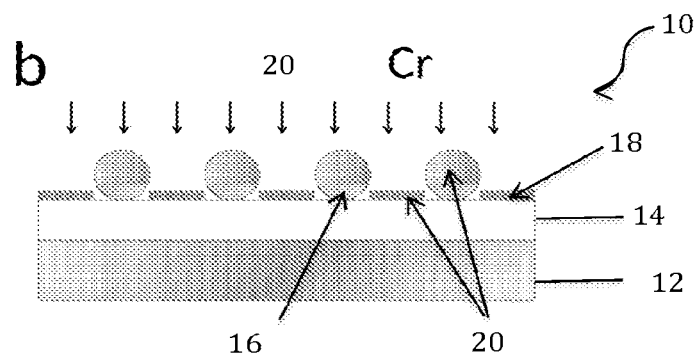
Figure 1C:
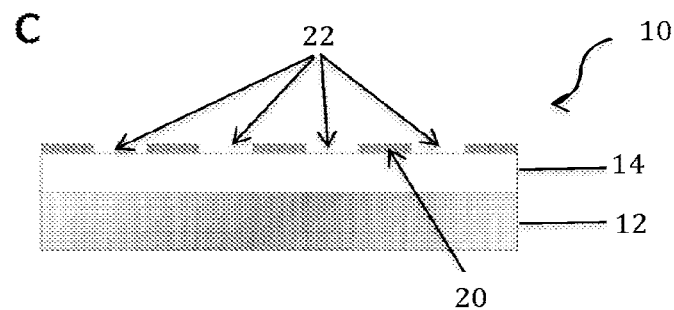
Figure 1D:
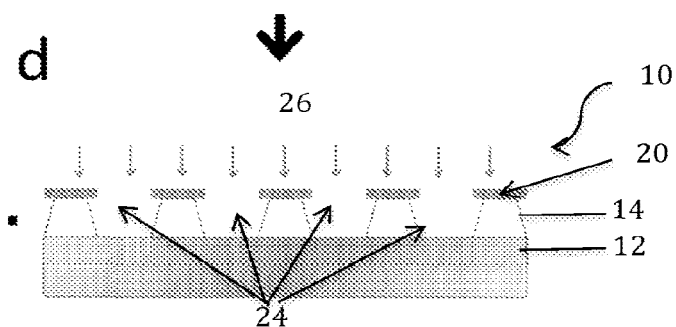
Figure 1E:
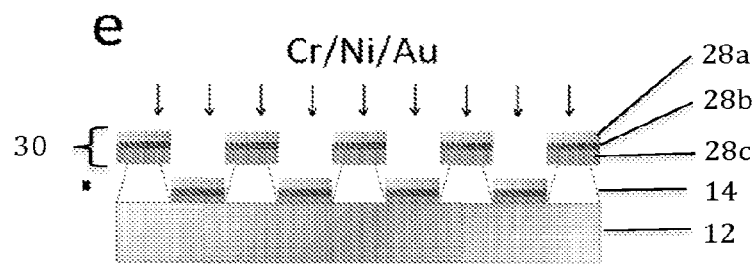
Figure 1F:
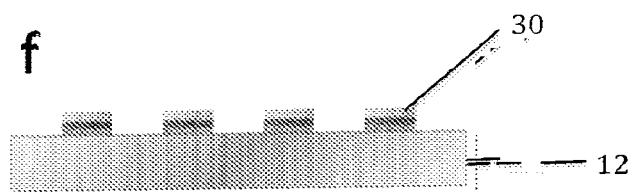

The nanomotor described herein is made of a nanowire rotor driven on a patterned magnetic nanobearing in the electric fields created by the AC voltages applied to quadrupole electrodes. Based on a conventional top-down process such as electron beam lithography (EBL), patterning nanomagnets, one of the key components of the nanomotor, is a bottleneck of a nanomotor fabrication process. To overcome low productivity, the patterned nanomagnets were fabricated with Poly-methyl methacrylate (PMMA)/Cr templates prepared through colloidal lithography. The nanomagnets have high density, uniformity, reproducibility and low cost within a set of microelectrodes. A fabrication process of the present invention is shown in FIGS. 1A to 1F. FIG. 1A shows the device 10 in which a substrate 12 on which a dissolvable, meltable or etchable layer 14 has been coated or deposited on the substrate 12, on or in which a nanoparticle 16 is shown. For example, the nanoparticle 16 can be a polystyrene (PS) nanosphere monolayer that can be uniformly dispersed on the surface 18 of the layer 14, which can be a poly(methyl methacrylate) (PMMA) film. FIG. 1B shows the next step in the process in which a thin layer of an etch-resistant material 20 is deposited on top of the layer 14. An example of etch resistant material 20 can be Cr. FIG. 1C shows the next steps in the process, wherein the nanoparticles 16 are removed from the device 10, leaving an array of nanoopenings 22 between the etch-resistant material 20 deposited on the layer 14. In FIG. 1D, the next step in the process involved the etching 26 of the layer 14 through the nanoopenings 22 to form nanoholes 26. One example of removal of the layer 14 through the nanoopenings 22 is oxygen reactive ion etching (RIE) using the Cr layer as an etch mask. In FIG. 1E, one or more layers (in this case shown as 28a, 28b, 28c), e.g., a Cr/Ni/Au thin film, is deposited into the nanoholes 22 and form into an large array of nanodots 30, which can be in this example Cr/Ni/Au magnetic nanodots 30. Finally, FIG. 1F shows the removal of the layer 14, which in this example is dissolved using, e.g., a PMMA remover, leaving nanodots 30 and substrate 12.

Figure 1G:
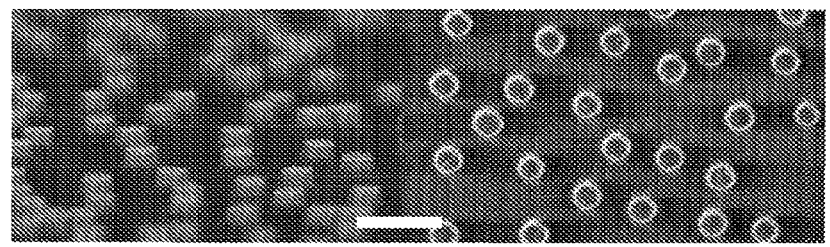
FIG. 1G shows Scanning Electron Microscope (SEM) images of a side (left panel) and top view (right panel) of arrays of nanomagnets 200 nm in diameter. Scale bar: 500 nm.
Figure 1H:
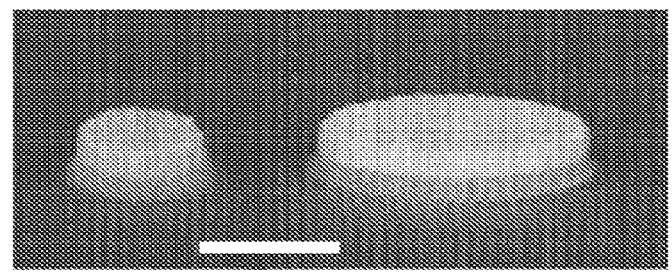
FIG. 1H shows an isometric view of patterned nanomagnets 500 nm and 1 µm in diameter. Scale bar: 500 nm.

The density and size of the nanomagnets are controlled by the concentration and the size of the PS nanospheres in the suspension and the process enables wafer-scale fabrication of nanomagnets at low cost, compare to the conventional lithographic techniques. FIG. 1G shows Scanning Electron Microscope (SEM) images of a side (left panel) and top view (right panel) of arrays of nanomagnets 200 nm in diameter. Scale bar: 500 nm. FIG. 1H shows as isometric view of patterned nanomagnets 500 nm and 1 μm in diameter. Scale bar: 500 nm.

It is worthy to mention that the fabrication method taught herein is not only useful for making the magnetic bearings for the miniature motors, but also applicable to any metals or multilayer nanodisks. Moreover, the miniature disks fabricated using this method have much better controlled morphology, which can be attributed to (but not a limitation of the present invention) the templates with large undercuts, ideal for the effective lift-off and avoiding of the redeposition issues.

Example 2—Electrode Design for Ultrahigh Speed Rotation

Figure 2:
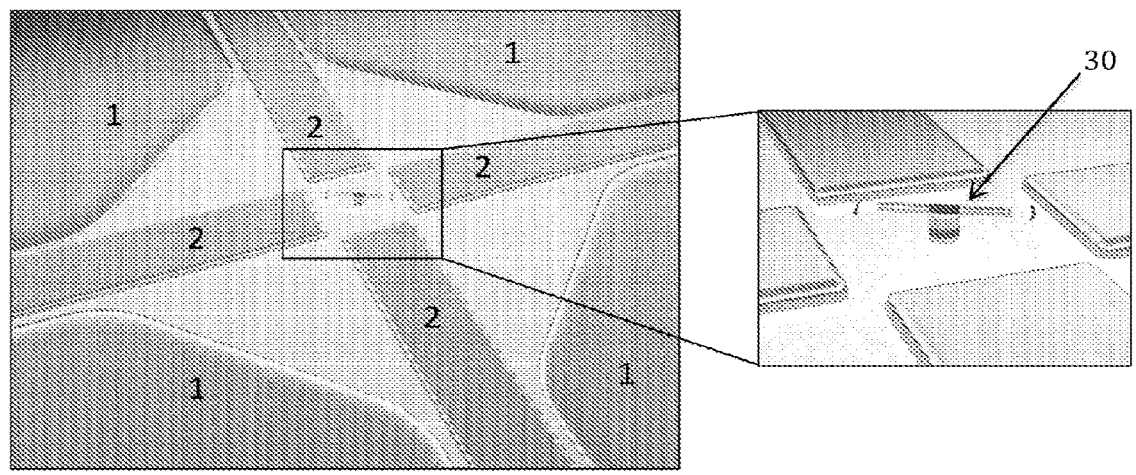
FIG. 2 is an illustration of a nanomotor with two sets of quadrupole electrodes and the close-up of a nanowire rotating on a patterned magnet. The set of quadrupole electrodes with wide gaps (1) is used for manipulating nanowires dispersed over a large area for assembling nanomotors and the other set with narrow gaps (2) generates high intensity electric fields for ultrahigh speed rotation.

On a substrate with a large array of nanomagnets were fabricated two sets of microelectrodes dedicated to the assembling and actuation of a nanomotor for ultrahigh speed rotation, respectively. FIG. 2 shows a set of electrodes 1 was designed with a wider gap distance (e.g. >300 μm) to remotely control and transport dispersed nanowires over a large area for the assembly, and a second set of microelectrodes 2 with much narrow gaps (e.g. <100 μm) were fabricated around an assembled nanomotor 30 to induce high intensity electric fields and, consequently, a large torque for the actuation. As a result, the nanomotor achieved a rotation speed to at least 18,000 rpm, which is the fastest rotating man-made nanoscale motors fixed at designed positions. The set of quadrupole electrodes with wide gaps (1) is used for manipulating nanowires dispersed over a large area for assembling nanomotors and the other set with narrow gaps (2) generates high intensity electric fields for ultrahigh speed rotation.

Example 3—Design of the Two-Electrode Set

In miniature motor systems, the electric fields generated by quadrupole electrodes play a role in transporting nanowires to patterned magnetic nanobearings for assembly of miniature motors as well as actuating the assembled miniature motors. Although reducing the distance between the electrodes is a simple and powerful way to enhance the rotation speed as the torque exerted on a nanowire rotor is proportional to the square of the electric field intensity and inversely proportional to the square of the distance between the electrodes, there is a clear bottom line because the gaps should be wide enough to accommodate sufficient wires dispersed over a large area for efficient manipulation and assembly. Using two sets of electrodes of the miniature motors can be assembled separately from the miniature motors. In the same manner, the miniature motors can be rotated separately. For example, the electrode with a wider gap can manipulate miniature entities dispersed in a large area and the other with narrow gaps can provide an assembled nanomotor with high E-field and driving power for ultrafast rotation. In this way, it is possible to achieve a high performance miniature motor without sacrificing their efficient assembly.

Figure 3:
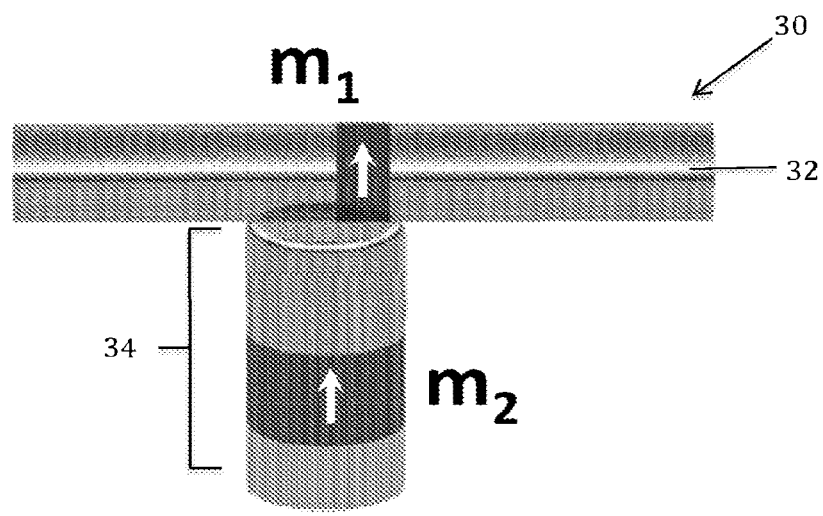
FIG. 3 shows a nanomotor with a perpendicular magnetic configuration, i.e. magnetic anisotropy of a nanowire (m1) and a patterned magnet (m2) perpendicular to the plane of rotation. This type of nanomotor rotates at stable and uniform speed like a step motor, having no periodic rotation speed fluctuation.

Example 4—Design of Magnetic Components of the Nanomotors for Uniform Rotation Speed In contrast to the rotation speeds of motors that periodically oscillate with angle/time (inventors' Nature Communications, 5, 3632, 2014), in the present invention the rotation periodicity of motors was reduced or eliminated by designing the magnetic anisotropy of both the miniature motors and magnetic bearings to have perpendicular anisotropy, as shown in FIG. 3. FIG. 3 shows a nanomotor 30 with a perpendicular magnetic configuration, i.e., magnetic anisotropy of a nanowire 32 (m1) and a patterned magnet 34 (m2) perpendicular to the plane of rotation. This type of nanomotor rotates at stable and uniform speed, having no periodic rotation speed fluctuation. As a result, this type of nanomotors can rotate like step motors, having no periodic rotation fluctuations, which is the first of its kind.

Figure 4:
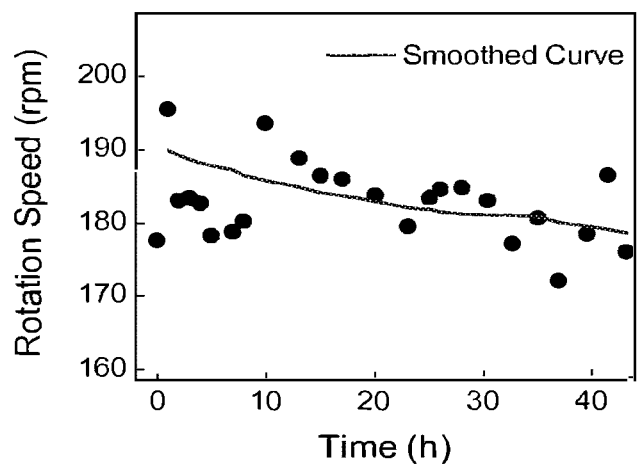
FIG. 4 is a graph that shows the rotation speed of a nanomotor continuously rotating for over 43 hours.

FIG. 4 is a graph that shows the rotation speed of a nanomotor of the present invention rotating continuously for over 43 hours. In certain embodiments, the rotation period can be increased to up to and over 80 hours by using a robust material, such as Ti, as the non-magnetic layer.

Example 5—Preparation of Diatom Frustule-Based Micromotor

Diatom frustules were obtained from commercially available diatomaceous earth powder and mixed with deionized (DI) water. Since the as-obtained diatom powders contain impurities and have a wide range of size distribution, small particles as well as broken pieces of diatom frustules were removed through multistep filtration with filter papers with a nominal pore size ~50 μm. The remaining diatom frustules were collected and sequentially cleaned and rinsed with 2-propanol (IPA), acetone, and DI water with a vortex mixer more than three times [FIG. 5(a)]. Then, the suspension was spread and dried on a silicon wafer before it was loaded into an e-beam evaporator. Cr, Ni, and Au thin films were deposited to make the diatom frustules magnetically active so that they could be facilely manipulated with external magnetic fields and assembled for NEMS devices. Because the Au thin film acts a passivation layer to prevent the magnetic Ni layer from directly contacting with the adjacent diatom frustules and the substrate, the aggregation of diatom frustules was minimized.

Figure 5:
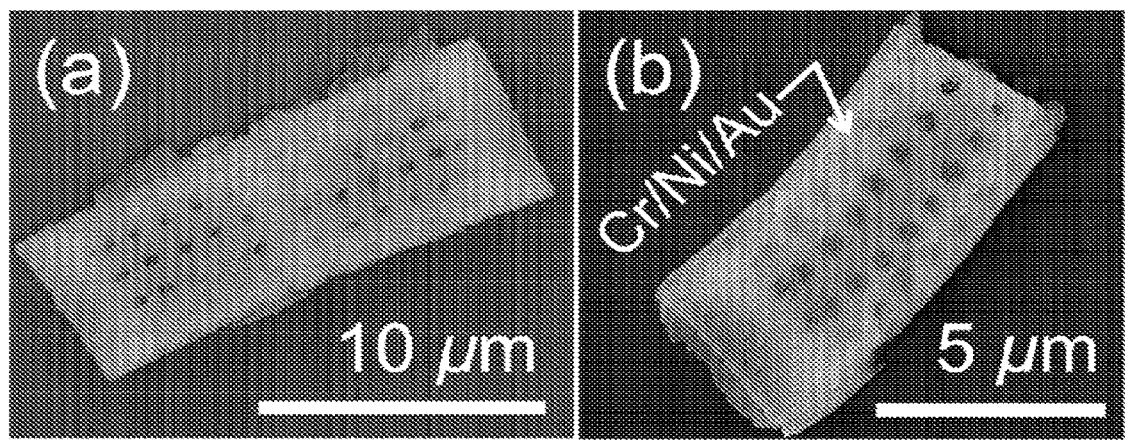
FIGS. 5A and 5B are scanning electron microscope (SEM) images of an as-obtained diatom frustule (FIG. 5A) and a Cr/Ni/Au-deposited diatom frustule (FIG. 5B).

The metal-coated diatoms on the Si wafer were sonicated, collected, and suspended in DI water and cleaned and rinsed with IPA, acetone, and DI water [FIG. 5(b)]. Although not fully covered with the metal thin films, the frustules had ferromagnetization and responded well to the external magnetic field. Through the simple procedures mentioned above, either non-ferromagnetic or ferromagnetic diatoms with different sizes and shapes can be efficiently prepared for NEMS actuators. Owing to the natural abundance and low cost ($10 for 10 lb.), they can be readily scaled up for mass production.

Figure 6:
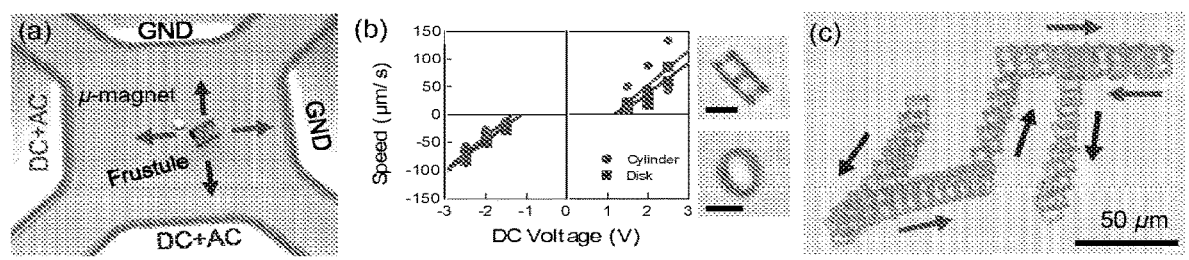
FIG. 6A is an illustration of the electric tweezers with two orthogonal sets of parallel microelectrodes for the manipulation of diatom frustules.
FIG. 6B depicts how velocity of diatom frustules is proportional to DC voltages. Optical microscopy images of diatom frustules in cylindrical or disk shapes. Scale bars: 10 µm.
FIG. 6C depicts diatom frustules manipulated by the electric tweezers to spell "UT."

Both magnetic and nonmagnetic frustules were precisely manipulated by the electric tweezers equipped with quadrupole microelectrodes, which generated either two orthogonal DC and AC E-fields or a rotating AC E-field for translational or rotational motion of diatom frustules, respectively [FIG. 6(a)]. Small particles suspended in a liquid medium move when E-fields are applied. Under a uniform DC E-field $E_{DC}$, particles with a charge q are transported along the field by the electrophoretic (EP) force, $FEP=qE_{DC}$. On the other hand, in a uniform AC E-field $E_{AC}$, dielectrophoresis (DEP) dominates motion of particles with dipole moment p. Although there is no net DEP force because the E-field gradient $\nabla E=0$, particles receive torque of $\tau e=p \times E_{AC}$ and are aligned parallel to the E-field. By the same token, in a rotating AC E-field created by four AC voltages applied to quadrupole microelectrodes with sequential 90° phase shift, particles can be rotated continuously.

Diatom frustules, either lying horizontally or standing vertically [FIG. 6(b)], were manipulated with the mechanisms discussed above. Diatom frustules moved faster with DC voltages applied to a set of parallel electrodes with fixed gap distance and the polarity of the DC voltages determined the moving direction. In this manner, the moving speed and direction can be precisely controlled with applied DC voltage $V_{DC}$ regardless of their shapes, dimensions, and postures [FIG. 6(b)]. With two sets of parallel electrodes, E-fields could be applied in two orthogonal directions and the motion of the frustules was separately controlled in each direction. Sequentially applying E-fields in either direction for controlled durations permits the controlled movement and assembly of the frustules.

Figure 7:
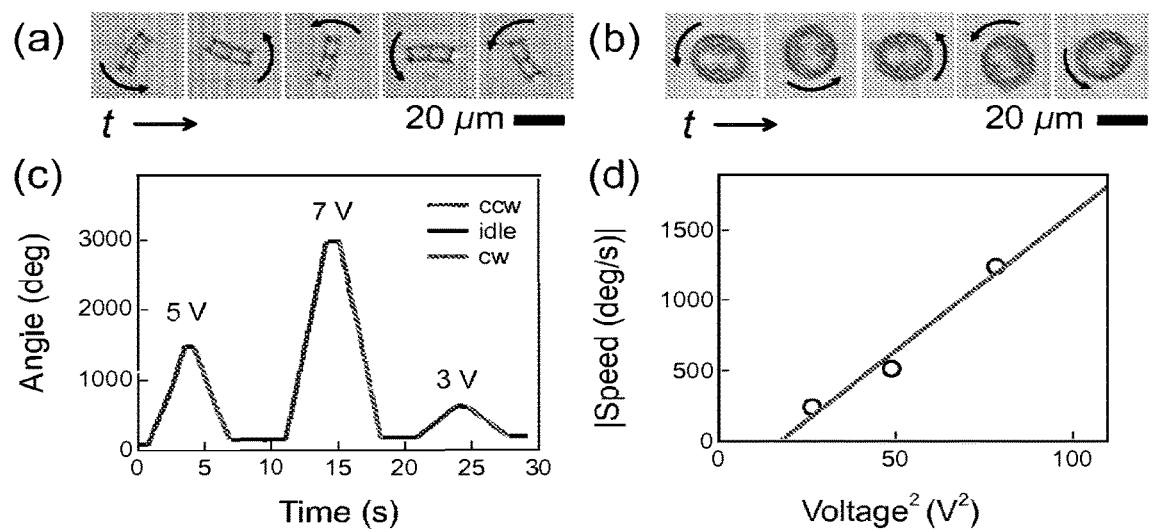
FIGS. 7A and 7B are sequential optical microscopy images of rotating diatom frustules in cylindrical (FIG. 7A) and disk shapes (FIG. 7B).
FIG. 7C depicts the accumulative angle of a diatom frustule rotating clockwise (cw) and counterclockwise (ccw) at different speeds depending on the applied AC voltage.
FIG. 7D depicts how rotation speed of a diatom frustule linearly increasing with the square of the applied AC voltage.

Rotation of diatom frustules is critical for various MEMS and microfluidic applications. Diatom frustules in both cylindrical and disk shapes were tested and successfully driven to rotate in AC E-fields [FIGS. 7(a) and (b)]. Rotation speed ω increased with the applied AC voltages and rotation direction, either clockwise (cw) or counterclockwise (ccw), swiftly switched depending on the AC phase sequence [FIG. 7(c)]. The rotation speed ω of diatom frustules, which were nonspherical particles, was proportional to the square of the AC voltage V [FIG. 7(d)].

In order to rotate the diatoms at fixed locations, site-specific assembly and actuation is important. Using patterned magnets and diatom frustules with magnetic coating, we magnetically assembled the rotary micromotor. The 6/80/100-nm-thick Cr/Ni/Au magnets with different diameters ranging 1-5 μm were fabricated via either photolithography or E-beam lithography followed by E-beam evaporation on the glass substrate with predefined microelectrodes. The suspension of diatom frustules coated with 3/40/25-nm-thick Cr/Ni/Au thin films [FIG. 5(b)] was dispersed over the magnets and electrodes and manipulated by the electric tweezers. Responses of the metal-coated diatom frustules to uniform DC and AC E-fields were similar to those of the pure diatom frustules [FIG. 6(b)]. Their translation speed linearly increased with DC voltages and the moving direction was fully controllable with two orthogonal E-fields. Using the electric tweezers, we could deliver metal-coated diatom frustules to patterned magnets. When close to the magnets, the frustules were magnetically attracted and attached to the magnets [FIG. 8(a)].

An assembled diatom frustule on a patterned magnet readily worked as a rotary MEMS actuator. The electric torque generated by rotating AC E-fields drives the rotation of the metal-coated diatom frustule rotors and their rotation speed and direction is precisely adjustable with the AC voltage and frequency. Similar to the pure rotating diatom frustules [FIGS. 7(c) and (d)], metal-coated diatoms rotated faster at high AC voltages with a quadratic dependence and switched their rotation direction upon reversing the phase sequence.

Figure 8:
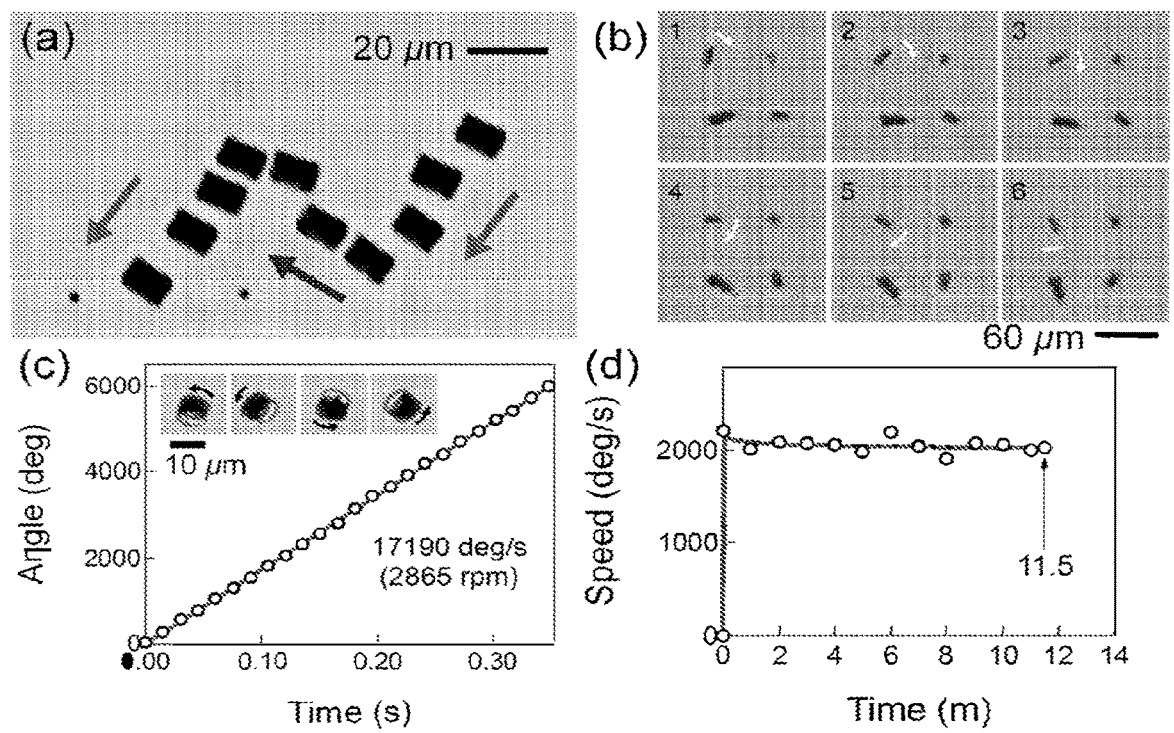
FIG. 8A depicts overlaid sequential micrographs of the assembly of a Cr/Ni/Au-coated diatom frustule and a patterned magnet using the electric tweezers.
FIG. 8B depicts sequential micrographs of multiple diatom frustule motors rotating simultaneously in a 2×2 array.
FIG. 8C depicts the accumulative angle of the fastest diatom frustule motor we have ever achieved (inset: sequential micrographs of the motor).
FIG. 8D depicts rotation speed of a diatom frustule motor continuously rotating for ~11.5 minutes.

Multiple micromotors can be assembled in the same ordered array. [FIG. 8(b)]. Arrays of micromotors cover larger areas and generate more power than a single micromotor, which would be useful for practical applications. A micromotor had a top rotation speed over 2800 rpm at 17

V/20 kHz AC voltages applied to the electrodes with 150 µm gap distances [FIG. 8(c)] and continuously rotated for ~11.5 minutes. [FIG. 8(d)].

Example 6—Individual Control of Multiple Miniature Motors

Figure 9:
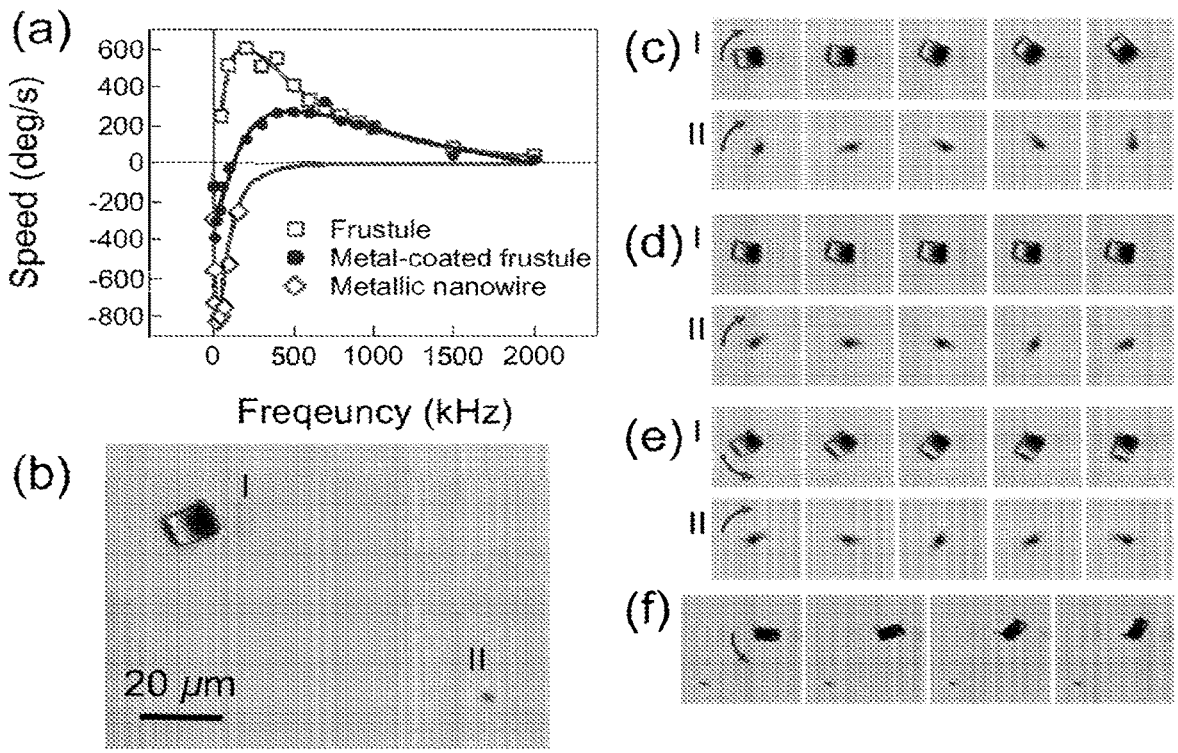
FIG. 9A depicts rotation speed of metallic nanowires (red, diamond), diatom frustules with (turquoise, squares) or without (blue, dots) Cr/Ni/Au layers. In the same rotating AC E-field, metallic nanowires and diatom frustules rotated in opposite directions, while metal-coated diatom frustules changed their rotation direction depending on the AC frequency.
FIGS. 9B-9F depict enhanced micrographs of individually controllable micromotors.

Metal-coated diatom frustules change their rotation direction depending on the AC frequency [FIG. 9(a)]. While rotating in the same direction as the metallic nanowires at low frequencies (up to ~100 kHz), the metal-coated diatom frustules reversed the rotation and followed the pure diatoms at high frequencies. The frequency at which the metal-coated frustules change direction can be designated the "crossover frequency." In comparison, the metallic nanowires and the pure diatoms maintained their rotation direction, either clockwise ("cw") or counterclockwise ("ccw"), over the whole range of AC frequencies from 1 kHz to 2 MHz [FIG. 9(a)].

Using the different rotation characteristics of the metal-coated diatom frustules and the metallic nanowires, individually controllable micro/nanomotors were integrated into a single device [FIG. 9(b)]. Cr/Ni/Au-coated diatom frustules and Au/Ni/Au nanowires were assembled on patterned magnets and rotated in AC electric fields simultaneously, but, in this case, their rotation speed and direction could be determined separately. Both rotated in the same direction at low frequency (10 kHz) [FIG. 9(c)]. Near the crossover frequency (45 kHz), the metal-coated diatom frustule cannot generate enough torque to overcome the friction and drag, and thus only the nanowire rotates [FIG. 9(d)]. When the frequency was increased higher than the crossover frequency, the frustule rotor rotates in the opposite direction, while the nanowire rotor was rotating in the same direction regardless of the frequency, which made the motors rotating in the opposite direction [FIG. 9(e)]. As the frequency further increases, the nanowire rotor finally stopped rotating and only the frustule motor was rotating [FIG. 9(f)]. In this way, each motor can be precisely controlled and it was even possible to turn on and off a single motor in an array. The enhanced controllability of single motors in multiple motor systems is be useful for developing practical applications and devices that could generate sophisticated force and motion, e.g., nano/microscale mechanical tweezers.

Example 7—Active Microfluidics

Figure 10:
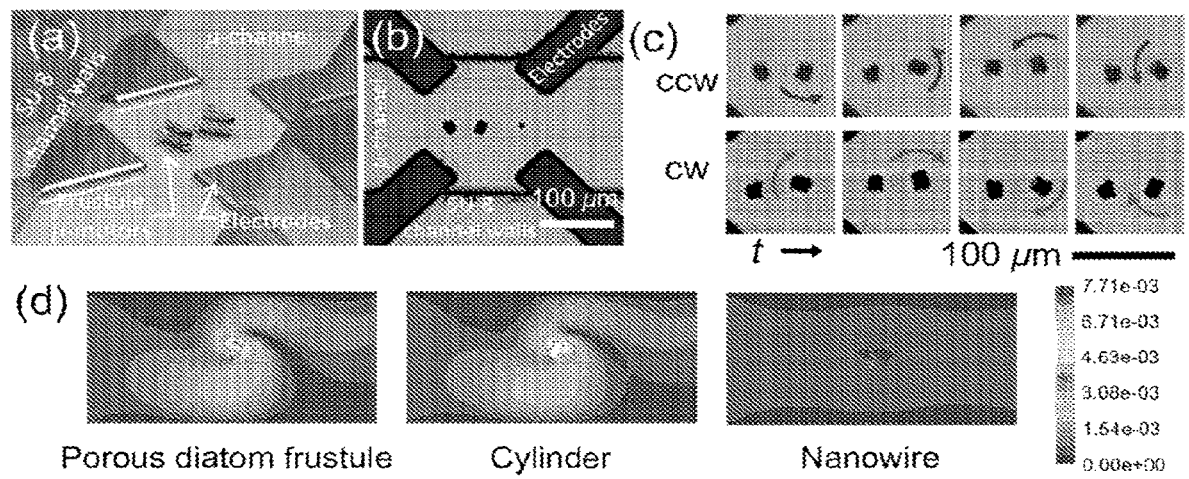
FIG. 10A depicts an illustration and FIG. 10B depicts a micrograph of an array of diatom frustule motors integrated into a microfluidic channel.
FIG. 10C depicts simultaneous rotation of diatom frustule motors in a microfluidic channel ccw and cw.
FIG. 10D depicts simulation results of the flow around a rotating diatom frustule motor, cylindrical microstructure, and nanowire in a microfluidic channel.

A SU-8 microchannel (~200 µm wide and ~50 µm deep) was patterned on a substrate with microelectrodes and 4-µm-diameter magnets via photolithography [FIGS. 10(a) and (b)]. A chamber sealed with a PDMS well and a cover glass was formed atop of the microchannel and filled with the suspension containing Cr/Ni/Au-coated diatom frustules. Since the electric tweezers were effective only in a limited area surrounded by the microelectrodes, we used the magnetic field gradient generated by a neodymium magnet for the manipulation of the diatom frustules suspended in a liquid medium. When moved to the vicinity of a magnet, a Cr/Ni/Au-coated diatom frustule was attracted and attached to the magnet and we could rotate an array of diatom frustule motors in a controlled manner [FIG. 10(a)-(c)].

In order to study the velocity distribution of the flow field, velocity contours and velocity vectors were generated from the two-dimensional simulations using ANSYS Fluent 15.0 (ANSYS, Inc., Canonsburg, Pa.). The velocity of the flow field in a microchannel (200 µm wide and 400 µm long) was calculated with the rotating nanowire (10 µm in length and 300 nm in diameter), solid cylinder (25 µm in length and 12 µm in diameter), or porous hollow cylinder (the same dimensions as the solid cylinder) emulating a diatom frustule [FIG. 10(d)]. The porous hollow cylinder had a shell thickness of 500 nm with nanopores 500 nm in diameter. To simplify the simulation, we used a two-dimensional cross sectional model with 16 nanopores. While the smallest mesh cells for the nanowire were 10 nm in length, those for the porous hollow cylinder were 20 nm in length. The meshes were generated with the Sliding Meshed Method so that the meshes surrounding the rotors followed their rotation. The flow at the microchannel inlet was set 500 µm/s and the rotational speed in all three cases was 300 rad/s≈2865 rpm. The Reynolds number in the systems was calculated to be around the magnitude of 0.1, four orders smaller than the critical Reynolds number. The solver was set to be transient (0.0004 s each time step, 10 time steps in total) and pressure based and the Laminar model was applied. The solid and porous cylinders generated much stronger velocity fields than the nanowire due to their large dimensions [FIG. 10(d)]. The area of the high velocity region with the porous hollow cylinder was even larger than that with the solid cylinder, which indicates the porous structure of diatom frustules could drag the surrounding fluid more efficiently and have huge potential for microfluidics, e.g., active microfluidic mixers.

Figure 11:
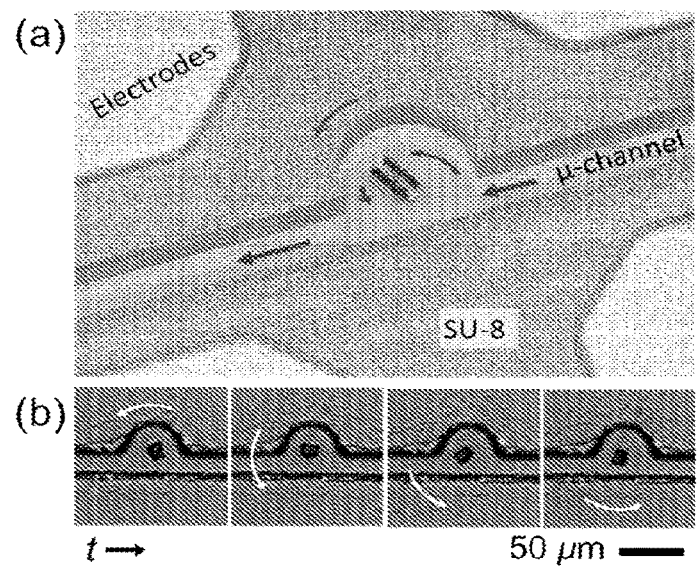
FIG. 11A depicts a schematic of the rotary micropump with the frustule motor and FIG. 11B depicts the sequential micrographs of the frustule micromotor rotating counterclockwise in the microfluidic pumping chamber. The red and the blue arrows in FIG. 11A indicate the rotation of the micromotor and the flow of the liquid medium in the microchannel, respectively.

The frustule motors can be used for microfluidic pumping. The motor assembled in a small pumping chamber in a microfluidic channel would work as a rotary micropump. When rotating, the rotor would efficiently drag liquid from the inlet into the chamber and release it to the outlet, which generates unidirectional flow along the microchannel [FIG. 11(a)]. The frustule motors were successfully assembled in the pumping chamber and could be rotated up to ~1.73 rounds per second [FIG. 11(b)], although further improvement of the pumping efficiency and performance is required.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), propertie(s), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

Additionally, the section headings herein are provided to provide organizational cues. These headings shall not limit or characterize the invention(s) set out in any claims that may issue from this disclosure. Specifically and by way of example, although the headings refer to a "Field of Invention," such claims should not be limited by the language under this heading to describe the so-called technical field. Further, a description of technology in the "Background of the Invention" section is not to be construed as an admission that technology is prior art to any invention(s) in this disclosure. Neither is the "Summary" to be considered a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A motor comprising:
    a) a substrate;
    b) a rotor;
    c) a nanobearing comprising a plurality of layers, said plurality of layers comprising;
        i) an adhesion layer coupled to the substrate;
        ii) a non-magnetic layer distal to the substrate and proximate to the rotor; and
        iii) a magnetic layer disposed between the adhesion layer and the non-magnetic layer;
    said layers arranged along a longitudinal axis perpendicular to the substrate;
    and
    d) a quadrupole electrode
    wherein the magnetic layer comprises:
        cobalt in combination with at least one metal selected from platinum, iron, nickel, and silver; or
        iron in combination with at least one metal selected from platinum, cobalt, nickel, and silver;
    wherein the rotor has a first end and second end opposite and spaced apart, wherein said first and second ends are circumferentially rotatable in a plane perpendicular to the longitudinal axis, wherein the rotation is not sinusoidal and does not exhibit periodic oscillations in speed.

2. The motor of claim 1, wherein the adhesion layer comprises chromium, titanium, or a combination thereof.

3. The motor of claim 1, wherein the non-magnetic layer present in the magnet bearing comprises chromium, gold, titanium, diamond thin film, graphene, graphite, silver, or copper.

4. The motor of claim 1, wherein the rotor is a nanowire.

5. The motor of claim 4, wherein the nanowire is Au/Ni/Au.

6. The motor of claim 1, wherein the rotor comprises a modified diatom frustule.

7. The motor of claim 6, wherein the modified diatom frustule comprises a mask layer covering a portion of the frustule, said mask layer comprising a plurality of nanoholes comprising at least one metallic layer.

8. The motor of claim 7, wherein the metallic layer in the mask layer comprises a mask-non-magnetic layer, a mask-magnetic layer, and a mask-adhesion layer.

9. The motor of claim 8, wherein the mask-non-magnetic layer comprises Cr, Au, Ti, carbon, graphene, graphite, $SiO_2$, Ag, Cu or a combination thereof, the mask-magnetic layer comprises Ni, Co, Fe, alloys thereof, or a combination thereof, and the mask-adhesion layer comprises Cr or Ti.

10. The motor of claim 9, wherein the mask-non-magnetic layer comprises Au, the mask-magnetic layer comprises Ni, and the mask-adhesion layer comprises Cr.

11. The motor of claim 1, wherein the nanobearing exhibits a perpendicular magnetic anisotropy.

12. The motor of claim 1, wherein the nanobearing has a diameter from about 200 nm to about 500 nm.

13. The motor of claim 1, wherein the rotor exhibits a perpendicular magnetic anisotropy, in-plane magnetic anisotropy, or a mixed magnetic anisotropy relative to a plane of motor rotation.

14. The motor of claim 1, wherein the motor is a step motor.

15. The motor of claim 1, wherein the motor is configured to provide from about 500,000 to about 2,000,000 rotations without failure.

16. A motor comprising:
   a) a substrate;
   b) a rotor having a perpendicular anisotropy;
   c) a nanobearing comprising a plurality of layers, said plurality of layers comprising and having a perpendicular anisotropy;
       iv) an adhesion layer coupled to the substrate;
       v) a non-magnetic layer distal to the substrate and proximate to the rotor; and
       vi) a magnetic layer disposed between the adhesion layer and the non-magnetic layer;
           said layers arranged along a longitudinal axis perpendicular to the substrate;
   and
   d) a quadrupole electrode
   wherein the magnetic layer comprises:
       cobalt in combination with at least one metal selected from platinum, iron, nickel, and silver; or
       iron in combination with at least one metal selected from platinum, cobalt, nickel, and silver;
   wherein the rotor has a first end and second end opposite and spaced apart, wherein said first and second ends are circumferentially rotatable in a plane perpendicular to the longitudinal axis, wherein the rotation is not sinusoidal and does not exhibit periodic oscillations in speed; and wherein the motor is a step motor.

* * * * *